United States Patent
Kandler et al.

(10) Patent No.: US 7,344,595 B2
(45) Date of Patent: Mar. 18, 2008

(54) METHOD AND APPARATUS FOR PURIFICATION OF CRYSTAL MATERIAL AND FOR MAKING CRYSTALS THEREFROM AND USE OF CRYSTALS OBTAINED THEREBY

(75) Inventors: Joerg Kandler, Cospeda (DE); Lutz Parthier, Kleinmachnow (DE); Thomas Kaufhold, Buergel (DE); Gunther Wehrhan, Jena (DE); Clemens Kunisch, Armsheim (DE)

(73) Assignee: Schott AG, Mainz (DE)

( * ) Notice: Subject to any disclaimer, the term of this patent is extended or adjusted under 35 U.S.C. 154(b) by 179 days.

(21) Appl. No.: 11/042,286

(22) Filed: Jan. 24, 2005

(65) Prior Publication Data

US 2005/0178316 A1 Aug. 18, 2005

(30) Foreign Application Priority Data

Jan. 26, 2004 (DE) .................. 10 2004 003 829

(51) Int. Cl.
*C30B 11/02* (2006.01)
(52) U.S. Cl. .................. 117/81; 117/82; 117/83; 117/218; 117/220
(58) Field of Classification Search .............. 117/81, 117/82, 83, 218, 220
See application file for complete search history.

(56) References Cited

U.S. PATENT DOCUMENTS

| | | | |
|---|---|---|---|
| 2,149,076 | A | 2/1939 | Stockbarger |
| 6,364,946 | B2 | 4/2002 | Staeblein et al. |
| 6,488,769 | B1 | 12/2002 | Oba |
| 6,875,275 | B1 | 4/2005 | Ichizaki |
| 6,969,502 | B2 | 11/2005 | Wehrhan et al. |
| 2001/0025598 | A1* | 10/2001 | Staeblein et al. ............. 117/81 |
| 2002/0166500 | A1 | 11/2002 | Yogo et al. |
| 2003/0070606 | A1* | 4/2003 | LeBlond et al. ............... 117/84 |
| 2003/0089306 | A1 | 5/2003 | Speit et al. |
| 2003/0089307 | A1 | 5/2003 | Wehrhan et al. |
| 2005/0263064 | A1* | 12/2005 | Bellman et al. .............. 117/81 |

FOREIGN PATENT DOCUMENTS

DE 100 10 484 A1 9/2001

(Continued)

OTHER PUBLICATIONS

Max Wutz et al: "Handbuch Vakuumtechnik Theorie und Praxis" (Vaccum Engineering, Theory and Practice), 6-th Edition, Vieweger Press, pp. 102-115, no date.

*Primary Examiner*—Robert Kunemund
(74) *Attorney, Agent, or Firm*—Michael J. Striker (57) ABSTRACT

The method for producing single crystals includes drying crystal raw material by removing water, reaction of impurities with a scavenger, preferably a metal halide, and homogenizing the melt. The method is performed with the raw material in a melt vessel with a variable-sized through-going opening, in which drying occurs at 100° C. to 600° C. for at least 20 hours with a geometric conductance value for the through-going opening of 2.00 to 30.00 mm$^2$; the reacting occurs at 600° C. to 1200° C. for at least nine hours with a geometric conductance value of 0.0020 to 0.300 mm$^2$ and the homogenizing occurs at above 1400° C. for at least six hours with a geometric conductance value of 0.25 to 1.1 mm$^2$. Alternatively the geometric conductance value is the same during drying, reacting and homogenizing and takes a value between 0.25 and 1 mm$^2$.

21 Claims, 3 Drawing Sheets

FOREIGN PATENT DOCUMENTS

| | | |
|---|---|---|
| DE | 102 08 157 A1 | 9/2002 |
| DE | 101 42 651 A1 | 3/2003 |
| DE | 103 47 430 A1 | 5/2005 |
| EP | 0 995 820 A1 | 4/2000 |
| JP | 10-330192 | 12/1998 |
| JP | 2000-191322 | 7/2000 |
| JP | 2003-525196 | 8/2003 |
| JP | 2003-525197 | 8/2003 |
| WO | 01/64975 A2 | 9/2001 |
| WO | 01/64977 | 9/2001 |

* cited by examiner

METHOD AND APPARATUS FOR PURIFICATION OF CRYSTAL MATERIAL AND FOR MAKING CRYSTALS THEREFROM AND USE OF CRYSTALS OBTAINED THEREBY

BACKGROUND OF THE INVENTION

1. Field of the Invention

The present invention relates to a method for purification or refining crystal material, especially highly pure crystal raw material, for making crystals with less optical extrinsic absorption, especially by a multi-step treatment process for further purifying the raw material. It also relates to an apparatus for performing this method, which has a closable melt vessel with at least one closable opening and also to the use of the crystals obtained with this method.

2. Related Art

Crystals, especially single crystals, are increasingly used for making optical elements, such as lenses, etc. Many such crystals are used for high energy, especially short wavelength, radiation transmission and thus are suitable for making optical systems, such as lasers. They are also used in microlithography for manufacture of circuitry in small electrical components, such as computer chips. Not only ever larger sizes or geometries of lenses and/or single crystals are required, but also purer, especially optically purer, crystals are increasingly required because of the decreasing size of this sort of circuitry due to further miniaturization. Thus for example, crystal dislocations and especially schlieren formation or other defocusing structures in the photolithographic imaging circuitry, which can lead to short circuits and thus malfunction of the entire computer chip with increasing miniaturization, enormously increase the losses during chip production. Also the heat generated by absorption at impurity and defect sites leads to thermal expansion of the optical elements during photolithography and thus to focal point changes, which similarly lead to poorer image formation.

Methods for large-scale production of oriented single crystals already exist. All these methods have in common that a crystal seed is brought into contact with a melt of crystal raw material and the melt is cooled starting from the crystal seed, which determines the orientation of the crystal that is formed. Thus, for example, U.S. Pat. No. 2,149,076 describes a so-called vertical Bridgeman method, in which a melt vessel is surrounded by annular heating jackets arranged above each other. The melt vessel is moved and/or lowered along a central axis within these heating jackets. If the temperatures in the heating jackets arranged above each other are set so that the temperature in the upper jacket is above the melting temperature and the temperature in the lower jacket is below the melting temperature and the melt vessel is slowly lowered from the upper heating jacket into the lower heating jacket, the melt in the melt vessel solidifies starting to grow from a crystal seed, thus forming a single crystal.

In other methods, in which vertical crystal growth takes place, several heating elements that are fixed in relation to the melt vessel are provided, whose individual temperature are controlled during crystal growth. The so-called vertical gradient freeze (VGF) method is among these other methods. The heating elements are individually controlled so that a vertical temperature gradient is produced in the melt. In contrast to the Bridgeman method however the crystal growth is not obtained by lowering of the melt vessel, but by reduction of the power supplied to the heating elements, so that the melt is cooled starting from the vessel bottom and/or a crystal seed pocket generally in an upward direction and the phase boundary surface between melt and solid rises as the crystal grows. This sort of crystal growth method for, among others, magnesium fluoride, barium fluoride, strontium fluoride and calcium fluoride, is described, for example, in WO-A 01/649 75.

In order to attain the required purity of the crystals, they are preferably made from a synthetically manufactured powder of crystal material. Usually the bulk density of this material amounts to only about a third of that of the finished grown crystal, which means that a sufficient amount of the powder must be fed into the melt or growth vessel, which is at least three times the height of the finished crystal. Since the melting, purifying and growing of the crystal especially requires a time interval of usually several months, especially in the case of large size single crystals, the drying, purifying and melting of the crystal raw powder should be attempted in a separate simply structured melting apparatus. In this way the expensive highly sensitive crystal growing apparatus is not burdened by preparative process steps and can be used exclusively for the actual crystal growth method, which increases productivity.

The manufacture of individual crystal blanks or ingots in a preparation process can take place separately in a simple and economical melting apparatus, in which no direct crystal growth takes place. Instead a polycrystalline body, a so-called ingot, is produced. In this preparation process the conventional powdery raw material is melted and condenses to form a compact body and at the same time the material is purified in a vessel, which preferably has dimensions which are comparable to those of the later used growth vessel. In contrast to a crystal growth process, the material is quickly cooled to room temperature at the end of this melting process, since no crystal solidification is required and a polycrystalline body is obtained. This sort of polycrystalline body is usually designated an ingot. This polycrystalline ingot is then used as a blank or starting body for the actual crystal growth process. The separate formation of an ingot and the later crystal growth process is designated the two-step or two-stage process. A complete manufacturing method, in which melting the power, purifying it, homogenizing it, growing the crystal, tempering it and cooling it, are performed is designated a one-step or one-stage process.

It has been shown that the quality of the latter formed crystal depends very strongly on the process parameters for the drying, scavenging and homogenizing stages and indeed independently of whether these stages occur in a one-stage or two-stage ingot process. Thus, for example, DE-A 102 08 157 describes a method for making a fluoride crystal, in which a fluoride raw material is dried in an open vessel under vacuum. After closing the vessel the dried raw material is reacted with a scavenger called a de-oxidation means. After finishing the de-oxidation reaction the vessel cover is again opened in order the remove the scavenger reaction products and if necessary to finish melting the still not completely melted crystal raw material.

SUMMARY OF THE INVENTION

It is an object of the present invention to provide a method and an apparatus for preparation of single crystals, especially large-volume single crystals, which are suitable for use as optical material with small extrinsic absorption properties. Thus the crystals obtained should have the smallest possible oxygen content and small diffuse scattering properties, for example at crystal anomalies, which occur at crystal dislocations.

It is also an object of the present invention to provide improved optical and electronic components incorporating the single crystals made by the method and apparatus according to the invention.

This object and others, which will be made more apparent hereinafter, are attained in a method and apparatus according to the appended claims.

It has been shown that especially defect-free and defect-poor single crystals can be obtained when special process parameter values are maintained within certain ranges during drying, scavenging and above all also during homogenizing the melt. Surprisingly it was found that the foreign material content, especially the oxygen content, in the ingot and/or the finished crystal and thus the scattering and absorption in the crystals made by the method and with the apparatus according to the invention can be significantly reduced by a combination of optimized temperatures and durations in the individual method steps and by suitable selection of the melt vessel opening. Furthermore the radiation resistance and laser damage occurring in these crystals can be considerably improved and thus large-volume single crystals with new improved not-previously-known quality can be manufactured reproducibly.

It has been shown according to the invention that impurities, like oxygen, then can be especially well removed, when the geometry of the vessel openings for the individual method steps is within respective individual ranges for the corresponding steps. This effect permits further improvements by optimizing the temperature profile and the time profile.

The invention thus concerns a method for purifying crystals and for making single crystals, especially in an apparatus, which comprises a closable vessel for melting of crystal raw material, in which the melt vessel has at least one closable opening.

The method itself comprises drying the crystal raw material. During this drying water that is absorbed and also adsorbed, and if necessary also crystallization water, are removed. Usually temperatures for drying the crystal raw material are in a range from 100° C. to 600° C. However temperatures of from 200° C. to 550° C. and especially from 300° C. to 500° C. are preferred. The duration of the drying usually amounts to at least 20 hours, preferably 60 hours. A drying time of at least 150 hours is especially preferred. Even longer drying times can be appropriate for special large amounts of crystal raw materials, especially with a great height.

In a further purification step impurities, especially oxides, are reacted with so-called scavengers, wherein interfering reaction products, which have a lower vaporization and/or sublimation point than the crystal raw material, are removed. Conventional or usual scavengers are $PbF_2$, $ZnF_2$ and/or $SnF_2$ with alkali and alkaline earth halides, for example calcium fluoride, barium fluoride, magnesium fluoride, strontium fluoride and their mixtures. The temperature for performing the scavenger reaction with $PbF_2$ amounts preferably to from 600° C. to 1200° C. However temperatures of from 700° C. to 1000° C. and especially 750° C. to 900° C. are preferred. For $ZnF_2$ temperature for performing the scavenger reaction amounts preferably to from 800° C. to 1400° C. However temperatures of from 900° C. to 1300° C. and especially 1000° C. to 1300° C. are preferred. The amounts used depend on the quality of the crystal raw material and amount preferably to from 0.5 to 3 percent by weight. In an especially preferred embodiment the scavenger reaction is performed slowly and usually with continuously increasing temperature. Temperature increase rates in this embodiment amounting to 1° C./hr to 35° C./hr and especially from 5° C./hr to 20° C./hr are preferred. According to the scavenger and the oxygen content, the temperature is maintained at a level of from 600° C. to 1000° C., preferably 650° C. to 800° C., and preferably for a reaction time interval of at least 100, usually 200 hours to 500, hours. A longer holding time is used for the lower temperatures and vice versa.

After performing the scavenging reaction a homogenization of the melt occurs by heating in a gradient. This gradient is obtained, for example, by heating the melt vessel with a cover heater and bottom heater at different temperatures. Temperatures of the heater arranged above the melt vessel of from 1410° C. and/or 1450° C. to 1800° C., preferably between 1500° C. and 1750° C. have proven to be suitable. Temperatures of the heater arranged below the melt vessel of from 1410° C. to 1850° C., preferably between 1460° C. and/or 1500° C. and 1750° C. have proven to be suitable. Although the above-described conductance values and temperatures according to the invention are valid for $BaF_2$ in the individual process steps, the method is preferably performed at somewhat lower temperatures and the same homogenization times in the case of $BaF_2$ because of its lower melting point. For example, during melting temperatures of 1350° C. to 1700° C., preferably 1360° C. to 1600° C., are present at the upper heater and of 1360° C. to 1750° C., preferably 1400° C. to 1650° C., at the lower heater. In the latter case conductance values of 0.10 to 0.50 $mm^2$ are preferred for the homogenization. The temperature gradient is preferably adjusted so that the melt at the bottom of the vessel is hotter than at the upper end of the vessel. Preferably an axial temperature gradient of at least 0.25° C./cm, especially at least 1° C./cm, is present. The homogenization is if necessary also achievable by mechanical stirring. This could occur both by means of a classical stirring element that is dipped in the melt and also be rotation of the melt vessel. Vessel rotation with changing reversing rotation directions is especially suitable. The apparatus for performing this sort of rotational homogenization is for example described in parallel DE-A 103 47 430 of the same inventors as the present disclosure. At least six hours is a suitable duration for the homogenization. However durations of at least 24 hours and especially at least 100 hours are preferred.

According to the invention it has been shown that the removal of moisture, products of the scavenger reaction and other impurities is especially successful when respective specially dimensioned vessel openings are present in the melt vessel. According to the invention during the drying a geometric conductance value for the vessel opening of from 2.00 to 30.00 $mm^2$, especially of from 2.25 to 24.75 $mm^2$, is preferred. For the scavenger reaction stage according to the invention a geometric conductance value of 0.0020 to 0.300 $mm^2$, especially of from 0.0025 to 0.27 $mm^2$, is preferred. During the homogenizing a geometric conductance value of from 0.25 to 2.30 $mm^2$, especially of from 0.80 to 1.20 $mm^2$, is preferred. It was found that with these conductance values a special pure, especially oxygen-free, crystal was obtained, which is characterized by less absorption behavior and less scattering.

In an alternative embodiment of the invention all three method steps, i.e. drying, scavenging reaction and homogenizing, can be performed with only a single through-going opening size, with a geometric conductance value $Lg=0.20$ to 1.5 $mm^2$, preferably 0.25 to 1 $mm^2$.

The geometric conductance value Lg of an opening is the product the throughput probability of a particle Ω and the opening area A and thus is a measure of the particle flow rate. Lg has the units of area, since the throughput probability is a dimensionless variable. The geometric conductance value is thus defined also as the effective cross-section according to the following formula (1):

$$Lg = A*\Omega \quad (1).$$

Figure 1:
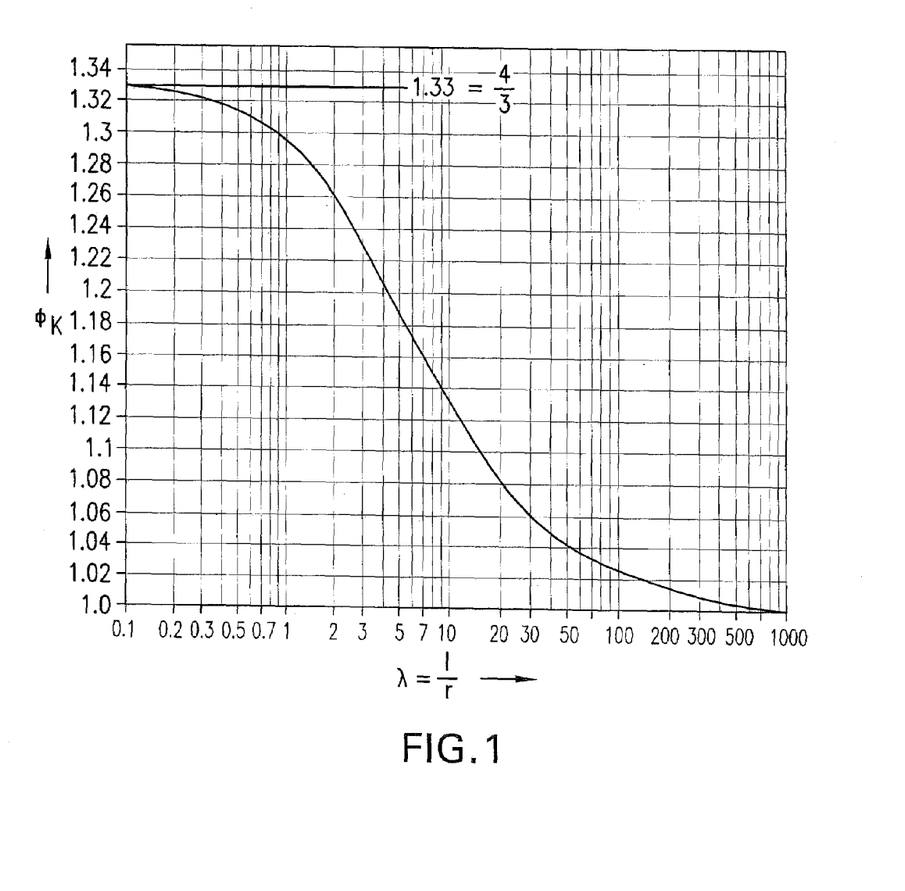
FIG. 1 is a graphical illustration for determination of a correction factor Φ for a circular cover opening or through-going hole.

The throughput probability Ω for a circular opening, i.e. a circular passage, with a passage radius r and a passage length l may be calculated by the following formula (2):

$$\Omega = 1/\{1+(3/8*l*[\Phi/r])\} \quad (2),$$

wherein Φ represents a correction factor with a value between 1.0 and 1.33. The determination of the correction factor is shown for example by means of the appended FIG. 1a. The determination of the conductance values is known to those skilled in the art and is described, for example, in the Handbook, "Vacuum Engineering, Theory and Practice {Vacuumtechnik, Theorie und Praxis}", by Wutz, Adam and Walcher, 6$^{th}$ Edition, 1997, Vieweger Press, pp. 102 and following. In that reference also correction curves for openings with square or elliptical cross-sections are disclosed.

The method according to the invention is suitable for alkali and alkaline earth fluorides, especially for calcium fluoride, barium fluoride, magnesium fluoride, strontium fluoride and their mixtures. The method according to the invention is also suitable for mixed crystals. The mixed crystals of calcium and strontium fluoride are especially preferred.

The invention also concerns an apparatus for performing the method. The apparatus comprises a closable melt vessel for melting the crystal raw material. The melt vessel itself contains an interior space for receiving raw material and a cover with an opening, which can be formed so that it is closable. Furthermore the apparatus according to the invention comprises a vacuum chamber, which is connected to the vessel interior space in the melt vessel and/or communicates with it. Moreover the apparatus according to the invention comprises heating elements for heating the vessel interior space and if necessary thermal insulation and elements for uniform distribution of the heat generated by the heating elements. In the apparatus according to the invention the vessel cover has a vessel opening with a closure member or plate, with which this vessel opening, especially the geometric conductance values of the vessel opening, can be changed. This can be accomplished for example by means of a slide mechanism, which provides passages or through-going openings of different sizes with different geometric conductance values.

In various embodiments according to the invention a mechanical or magnetically controlled valve can provide a variable sized vessel opening. Thus it is possible to set the respective desired geometric conductance values by different adjustments or settings of the valve, i.e. suitable opening degrees or angles and even by complete closing and opening of valves of different forms. Mechanical valves, for example, can be opened or closed by mechanical mechanisms, which are movable from outside of the apparatus. Mechanical elements for mechanical control of a mechanical valve are known to those skilled in the mechanical arts, for example mechanical elements, which are embedded in graphite and/or made completely from graphite in a known manner.

The apparatus according to the invention is distinguished from the prior art in that the vessel opening and/or cover opening or openings can be controlled by means of the above-described known control mechanisms to provide respective conductance values of from 2 to 30 mm$^2$, especially 2.2 to 25 mm$^2$, preferably from 2.25 to 24.75 mm$^2$, during drying; and from 0.0020 to 0.30 mm$^2$, especially 0.0025 to 0.27 mm$^2$, during reacting; and from 0.25 to 2.30 mm$^2$, especially 0.30 to 1.0 mm$^2$, during the homogenizing.

BRIEF DESCRIPTION OF THE DRAWING

The objects, features and advantages of the invention will now be illustrated in more detail with the aid of the following description of the preferred embodiments, with reference to the accompanying figures in which:

FIG. 2b is a schematic cross-sectional view showing the melt vessel with its cover separated from the apparatus shown in FIG. 2a.

DESCRIPTION OF THE PREFERRED EMBODIMENT

Figure 2A:
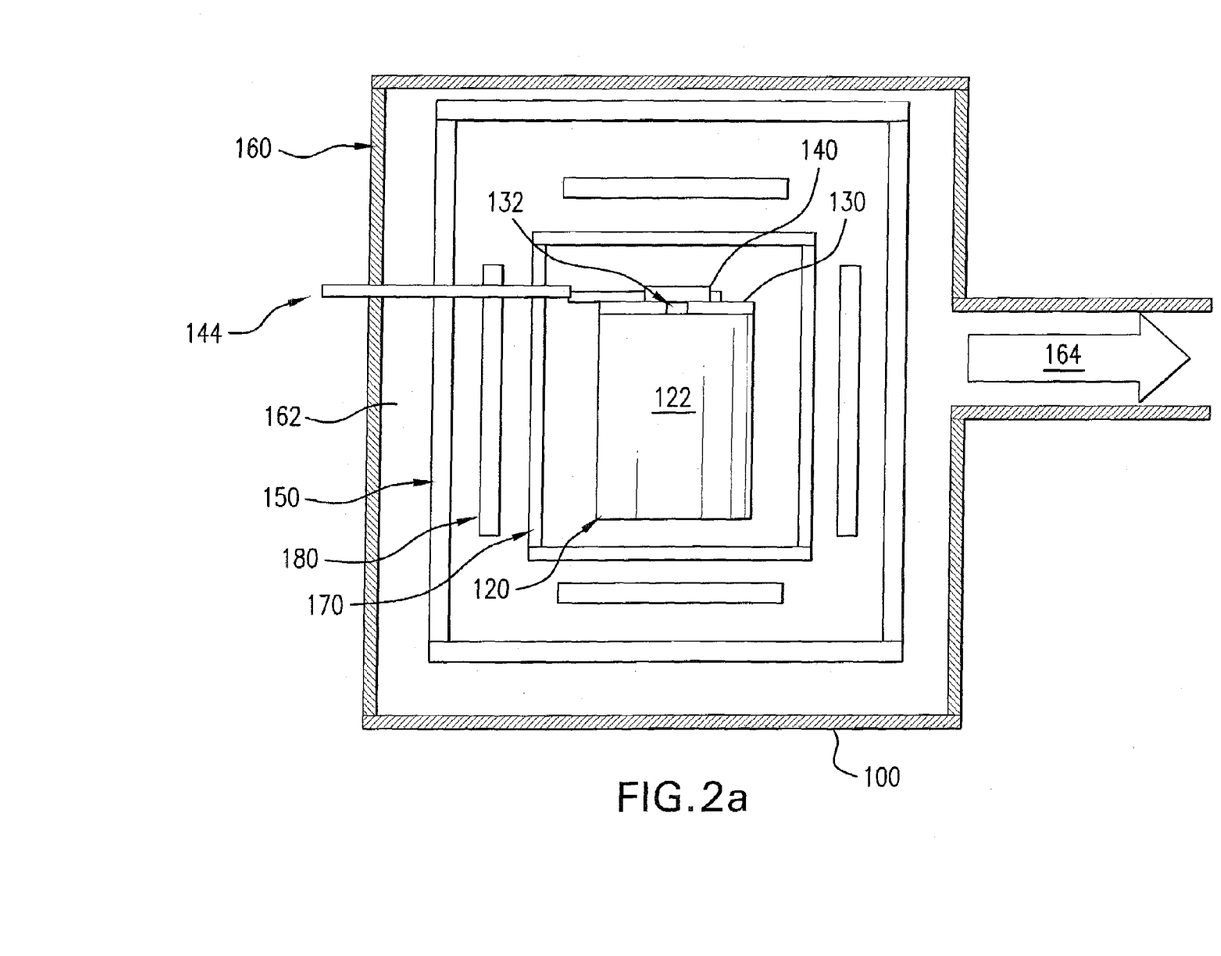
FIG. 2a is a schematic cross-sectional view of an apparatus for performing the melting according to the invention.
Figure 2B:
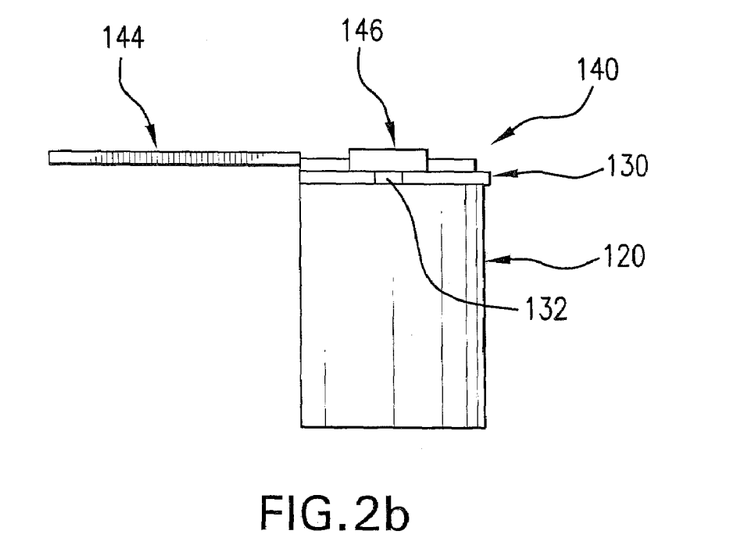
Figure 2C:
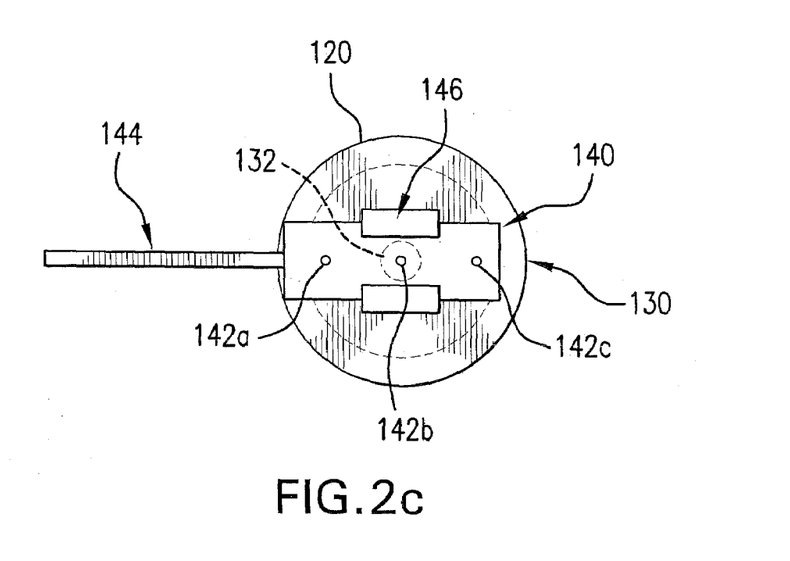
FIG. 2c is a plan view of a cover for the melt vessel with a variable cover opening according to the invention.

The apparatus 100 according to the invention comprises a melt vessel 120, which has a cover 130. The cover 130 itself has a closable opening 132, which is covered with a closure plate 140. The closure plate 140 is slidably mounted on the cover 130 by means of lateral guide or hold-down 146. The slidable closure plate 140 has three through-going openings 142a, 142b, 142c with different diameters. The respective through-going openings 142a, 142b, 142c correspond to the different geometric conductance values given in the claims. The closure plate 140 is closable by means of push rod 144, which extends through the outer housing 160 of the apparatus. In this way it is possible to set different geometric conductance values as required for each process step so that the slidable plate 140 functions as a mechanical valve.

The vessel 120 is surrounded by plates 170, which distribute the heat of the upper, lower and lateral heating elements 180. The apparatus is provided with insulation 150 for preventing loss of heat to the exterior. The outer housing 160 comprises an interior evacuated chamber 162, which communicates by means of opening 132 in the vessel cover 130 with the vessel interior 122, so that volatile components can leave the vessel interior 122 and reach the evacuated chamber 162 and then collect there in the case of cooling if necessary (not shown). The outer housing 160 has a vacuum line 164, which is connected to a vacuum source or vacuum pump.

The large-volume crystals obtained with the method according to the invention, especially those comprising calcium fluoride, barium fluoride, magnesium fluoride, strontium fluoride and their mixtures, are particularly suitable for making optical components for DUV lithography and for making of wafers coated with photo-lacquer and thus for making of electronic equipment. The invention thus concerns the use of the single crystals made by the method and/or apparatus according to the invention for making lenses, prisms, light conducting rods, optical windows and optical apparatus for DUV lithography, especially for making steppers and excimer lasers, and thus also for making integrated circuits as well as electronic equipment, such as computers containing computer chips and other electronic units, which contain chip-like integrated circuitry.

EXAMPLE 1

In a melt vessel 60 kg of high purity synthetic calcium fluoride powder, in which cationic impurities typically were less than 1 ppm, were mixed uniformly with 1 percent by weight of $PbF_2$ (typical amounts are 0.5 to 3 percent by weight). The melt vessel 120 was closed by means of a vessel cover 130 having an opening 132. A plate-shaped sliding mechanism for closing the opening was arranged on the vessel cover. The mechanism included passages or through-going holes 142a, 142b, 142c with respective radii of 4 mm, 0.15 mm and 1.2 mm and lengths of 10 mm, which corresponded to the different geometric conductance values of 24.7461 $mm^2$, 0.0025 $mm^2$ and 1.0195 $mm^2$. After filling and closing the melt vessel a vacuum of $0.9*10^{-3}$ Pa ($0.9*10^{-5}$ mbar) was produced at the vessel exterior and one of the through-going holes was arranged to coincide with the vessel opening 132. Subsequently the temperature was increased to 700° C. and increased from there with a heating rate of 12° C. per hour to 1000° C. Subsequently homogenization was performed for 80 or 120 hours with an upper heating element temperature of 1500° C. and a lower heating element temperature of 1600° C., which corresponds to an axial temperature gradient of about 1° C./cm in the vessel. After finishing the melt was allowed to cool with a speed of 5° C. per hour and after solidification it was cooled further to 200° C. at 15° C. per hour. An oriented large-volume single crystal with a diameter of 385 mm and a height of 161 mm was made from the resulting blank, as described in WO-A 01/649 75.

The foregoing method was performed now with different vessel openings. In these tests both the loss of material from the vessel and also the oxygen content were determined in the blank and in the finished crystal. The oxygen content was measured by means of SIMS (secondary ion mass spectrometry). During the measurement the surface of a sample to be tested is bombarded with noble gas ions. After a lengthy bombardment (sputtering) a few microns of the surface is eroded. The concentration of oxygen stabilizes itself with continuing erosion. Then a stable signal corresponds to the amount of oxygen present in the volume.

Similarly the diffuse scattering in the finished crystal was determined. The scattering was measured according to a qualitative or subjective method in which the degree or extent of scattering is classified in four stages according to an observer: a value of 0 indicates no visually observed scattering, a value of 1 indicates only weak scattering, a value of 2 indicates moderate scattering and a value of 3 indicates strong scattering.

The determination of the scattering occurs optically by eye of an observer. The sample is tested in a darkened room with an engraving lamp and compared with a standard sample.

The absorption is measured by determination of the $k_0$ value. The $k_0$-value is a calculated absorption coefficient for radiation with energy density 0. For this determination the front surface of a 10 cm long crystal sample is polished, in order to keep the surface losses near the reflection losses computed from the Fresnel equation. A laser beam is divided by means of a beam splitter for this measurement. One beam from the beam splitter is conducted through the sample to a first detector and the other beam is conducted as a reference beam directly to a second detector. In this way it is possible to avoid measurement errors caused by fluctuations or drift of the laser intensity. The transmission is measured for different, usually three different, energy densities. Typical energy densities are in a range of 1 $mJ/cm^2$ to 100 $mJ/cm^2$. For determination of the desired absorption coefficient for energy density $\epsilon_0=0$ the respective k values are plotted versus the $\epsilon$ values and $k_0$ is determined by extrapolation and a linear fit of the experimentally obtained data points $\epsilon_1 k_1$, $\epsilon_2 k_2$ and $\epsilon_3 k_3$. The values listed in the following tables were obtained in this way. As can be seen from these tables, the crystals obtained by means of the method according to the invention not only are characterized by an extremely improved small absorption, but also no detectable diffuse scattering. Furthermore the crystals and crystal blanks have considerably reduced oxygen content.

TABLE I

EXPERIMENTAL RESULTS USING THE SAME HOLE SIZE DURING DRYING, SCAVENGING AND HOMOGENIZING

| | Lg, $mm^2$ | | | | | | |
|---|---|---|---|---|---|---|---|
| | 0 | 0.0025 | 0.0301 | 0.2719 | 1.0195 | 2.2477 | 24.7461 |
| $CaF_2$ loss per Vessel, g | 20 | 32 | 81 | 152 | 256 | 360 | 1280 |
| O content in Ingot, ppm | 22 | 12 | 8 | 10 | 5 | 9 | 20 |
| O content in Crystal, ppm* | 12 | 10 | 7 | 8 | 6 | 6 | 11 |
| Diffuse Scattering in Crystal | Strong | Weak | None | None to weak | None | None to weak | Moderate |
| Absorption Coefficient $k_0$ at 157 nm, $cm^{-1}$ (start) | $1.5*10^{-3}$ | $1.1*10^{-3}$ | $3.0*10^{-4}$ | $4.4*10^{-4}$ | $2.1*10^{-4}$ | $5.4*10^{-4}$ | $1.3*10^{-3}$ |

TABLE I-continued

EXPERIMENTAL RESULTS USING THE SAME HOLE SIZE DURING DRYING, SCAVENGING AND HOMOGENIZING

| | Lg, mm² | | | | | | |
|---|---|---|---|---|---|---|---|
| | 0 | 0.0025 | 0.0301 | 0.2719 | 1.0195 | 2.2477 | 24.7461 |
| Absorption Coefficient $k_0$ at 157 nm, cm$^{-1}$ (end) | $2.1 * 10^{-3}$ | $1.5 * 10^{-3}$ | $6.8 * 10^{-4}$ | $4.7 * 10^{-4}$ | $3.6 * 10^{-4}$ | $6.6 * 10^{-4}$ | $2.5 * 10^{-3}$ |

*average values of samples taken from the end and beginning of the crystal

TABLE II

EXPERIMENTAL RESULTS USING DIFFERENT HOLE SIZES DURING DRYING, SCAVENGING AND HOMOGENIZING

| | Experiment No. | | | | | | |
|---|---|---|---|---|---|---|---|
| | 1, comp. | 2, comp. | 3, comp. | 4, comp. | 5 | 6, comp. | 7 |
| Lg, mm² in drying | 0.0301 | 0.0301 | 0.0301 | 0.2719 | 1.0195 | 2.2477 | 2.2477 |
| Lg, mm², in savenging | 0.0025 | 0.2719 | 2.2477 | 0.2719 | 1.0195 | in vessel | 0.0025 |
| Lg, mm², in homogenizing | 1.0195 | 1.0195 | 1.0195 | 0.2719 | 1.0195 | 1.0195 | 1.0195 |
| CaF$_2$ loss per Vessel, g | 265 | 240 | 250 | 152 | 256 | 268 | 271 |
| O content in Ingot, ppm | 13 | 8 | 12 | 10 | 5 | 15 | 3 |
| O content in Crystal, ppm* | 10 | 5 | 11 | 8 | 6 | 13 | 2 |
| Diffuse Scattering in Crystal | Weak | None | None to Weak | None to weak | None | Moderate | None |
| Absorption Coefficient $k_0$ at 157 nm, cm$^{-1}$ (start) | $5.9 * 10^{-4}$ | $4.5 * 10^{-4}$ | $4.0 * 10^{-4}$ | $4.4 * 10^{-4}$ | $2.1 * 10^{-4}$ | $5.8 * 10^{-4}$ | $7.2 * 10^{-5}$ |
| Absorption Coefficient $k_0$ at 157 nm, cm$^{-1}$ (end) | $8.1 * 10^{-4}$ | $5.5 * 10^{-4}$ | $8.6 * 10^{-4}$ | $4.7 * 10^{-4}$ | $3.6 * 10^{-4}$ | $7.2 * 10^{-4}$ | $8.4 * 10^{-5}$ |

| | Experiment No. | | | | |
|---|---|---|---|---|---|
| | 8 | 9, comp. | 10 | 11 | 12 |
| Lg, mm² in drying | 2.2477 | 2.2477 | 24.7461 | 24.7461 | 24.7461 |
| Lg, mm², in savenging | 0.2719 | 2.2477 | 0.0025 | 0.2719 | 2.2477 |
| Lg, mm², in homogenizing | 1.0195 | 2.2477 | 1.0195 | 1.0195 | 1.0195 |
| CaF$_2$ loss per Vessel, g | 242 | 360 | 254 | 259 | 248 |
| O content in Ingot, ppm | 4 | 9 | 5 | 3 | 10 |
| O content in Crystal, ppm* | 3 | 6 | 2 | 3 | 8 |
| Diffuse Scattering in Crystal | None | None to Weak | None | None | Weak |
| Absorption Coefficient $k_0$ at 157 nm, cm$^{-1}$ (start) | $8.3 * 10^{-5}$ | $5.4 * 10^{-4}$ | $5.5 * 10^{-5}$ | $8.5 * 10^{-5}$ | $4.4 * 10^{-4}$ |
| Absorption Coefficient $k_0$ at 157 nm, cm$^{-1}$ (end) | $8.3 * 10^{-5}$ | $6.6 * 10^{-4}$ | $7.7 * 10^{-5}$ | $9.5 * 10^{-5}$ | $7.5 * 10^{-4}$ |

*average values of samples taken from the end and beginning of the crystal
comp. = comparative Parts List 100 apparatus
120 melt vessel
122 vessel interior space
130 vessel cover
132 vessel opening
140 slidable closure plate
142a, b, c through-going openings
144 push rod
146 lateral guide and plate hold-down
150 insulator
160 outer housing
162 evacuated chamber 164 vacuum line
170 plate
180 heating elements The disclosure in German Patent Application DE 10 2004 003 829.5 of Jan. 26, 2004 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method and apparatus for purification of crystal material and for making crystals therefrom and use of crystals obtained thereby, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method for making a crystal with less absorption, less diffuse scattering and less radiation damage, in which crystal raw material is purified in a purification apparatus, said purification apparatus comprising a closable melt vessel for melting the crystal raw material and said closable melt vessel having at least one through-going opening, said method comprising the steps of:
  a) drying the crystal raw material by removal of absorptive, adsorptive and/or chemically bound water at a drying temperature of 100° C. to 600° C. over a drying time interval of at least 20 hours, said at least one through-going opening having a geometric conductance value of from 2.00 mm$^2$ to 30.00 mm$^2$ during the drying;
  b) reacting impurities contained in the crystal raw material with at least one scavenger at a reaction temperature of from 600° C. to 1200° C. for a reaction time interval of at least nine hours, said at least one through-going opening having a geometric conductance value of from 0.0020 mm$^2$ to 0.300 mm$^2$ during the reacting; and
  c) melting the crystal raw material to form a melted portion and homogenizing the melted portion at a homogenizing temperature above 1400° C. for a homogenizing time of at least six hours, said at least one through-going opening having a geometric conductance value of from 0.25 mm$^2$ to 1.1 mm$^2$ during the homogenizing.

2. The method as defined in claim 1, further comprising performing the drying, reacting of the impurities with the scavenger and the homogenizing under a vacuum of at least 10 millimeters.

3. The method as defined in claim 1, wherein the homogenizing comprises applying an axial temperature gradient in the melted portion of at least 0.25° C./cm.

4. The method as defined in claim 1, wherein said scavenger is a metal halide, said metal halide containing metal, and wherein said metal is at least one member selected from the group consisting of Pb, Zn and Sn.

5. The method as defined in claim 1, wherein said geometric conductance value during said drying is from 2.25 mm$^2$ to 24.75 mm$^2$.

6. A method for making a crystal with less absorption, less diffuse scattering and less radiation damage, in which crystal raw material is purified in a purification apparatus, said purification apparatus comprising a closable melt vessel for melting the crystal raw material and said closable melt vessel having at least one through-going opening, said method comprising the steps of:
  a) drying the crystal raw material by removal of absorptive, adsorptive and/or chemically bound water at a drying temperature of 100° C. to 600° C. over a drying time interval of at least 20 hours, said at least one through-going opening having a geometric conductance value of from 0.25 mm$^2$ to 1 mm$^2$ during the drying;
  b) reacting impurities contained in the crystal raw material with at least one scavenger at a reaction temperature of from 600° C. to 1200° C. for a reaction time interval of at least nine hours, said at least one through-going opening having a geometric conductance value of from 0.25 mm$^2$ to 1 mm$^2$ during the reacting; and
  c) melting the crystal raw material to form a melted portion and homogenizing the melted portion at a homogenizing temperature above 1400° C. for a homogenizing time of at least six hours, said at least one through-going opening having a geometric conductance value of from 0.25 mm$^2$ to 1 mm$^2$ during the homogenizing;
  wherein said geometric conductance value of the at least one through-going opening is the same during the drying, reacting and melting.

7. The method as defined in claim 6, further comprising performing the drying, reacting of the impurities with the scavenger and the homogenizing under a vacuum of at least 10 millimeters.

8. The method as defined in claim 6, wherein the homogenizing comprises applying an axial temperature gradient in the melted portion of at least 0.25° C./cm.

9. The method as defined in claim 6, wherein said scavenger is a metal halide comprising metal and said metal is at least one member selected from the group consisting of Pb, Zn and Sn.

10. An apparatus for making large-volume crystals with less absorption, less diffuse scattering and less radiation damage, said apparatus comprising
  a closable melt vessel (120) for melting crystal raw material, said melt vessel containing a vessel interior space (122) for receiving the crystal raw material, which is provided with at least one closable vessel opening (132);
  an evacuated chamber (162) communicating with the vessel interior space (122) of the melt vessel (120) via the at least one closable vessel opening (132);
  at least one heating element (180) for heating of the vessel interior space (122); and
  optionally heat insulation (150) and heat distributing elements (170);
  wherein the at least one closable vessel opening (132) has at least three respective different geometric conductance values including a first value of from 2.2 mm$^2$ to 25.00 mm$^2$, a second value of from 0.002 mm$^2$ to 0.30 mm$^2$ and a third value of from 0.25 mm$^2$ to 1.1 mm$^2$.

11. The apparatus as defined in claim 10, further comprising a sliding member (140) for the melt vessel, said sliding member being provided with a plurality of through-going openings (142a, 142b, 142c) corresponding to said first value, said second value and said third value of said different geometric conductance values respectively.

12. The apparatus as defined in claim 10, further comprising a valve for the melt vessel, said valve being controllable to provide said respective different geometric conductance values.

13. An optical component comprising a crystal, said crystal being obtainable by the method as defined in one of claims 1 to 9.

14. An optical component comprising a crystal, said crystal being obtainable by the method as defined in one of claims 1 to 9, said optical component being selected from the group consisting of lenses, prisms, light conducting rods and optical windows.

15. An optical component comprising a crystal, said crystal being obtainable by a method performed by the apparatus according to one of claims 10 to 12.

16. An optical component comprising a crystal, said crystal being obtainable by a method performed by the apparatus according to one of claims 10 to 12, said optical component being selected from the group consisting of lenses, prisms, light conducting rods and optical windows.

17. An electronic device comprising a crystal, said crystal being obtainable by the method as defined in one of claims 1 to 9.

18. An electronic device comprising a crystal, said crystal being obtainable by a method performed by the apparatus according to one of claims 10 to 12.

19. A large-volume single crystal having a diameter of at least 20 cm, a height of at least 20 cm, no optically observable light scattering, a $k_0$-value of less than $10^{-4}$ cm$^{-1}$ at 157 nm and oxygen content of at most four ppm.

20. An optical component comprising the large-volume single crystal as defined in claim 19, wherein said optical component is selected from the group consisting of lenses, prisms, light conducting rods and optical windows.

21. A large-volume calcium fluoride single crystal having a diameter of 385 mm, a height of 161 mm, no optically observable light scattering, and either a $k_0$-value of 8.4 ×$10^{-5}$ cm$^{-1}$ at 157 nm and an oxygen content of 2 ppm;

a $k^0$-value of 8.3 ×$10^{-5}$ cm$^{-1}$ at 157 nm and an oxygen content of 3 ppm;

a $k^0$-value of 7.7 ×$10^{-5}$ cm$^{-1}$ at 157 nm and an oxygen content of 3 ppm; or a $k^0$-value of 9.5 ×$10^{-5}$ cm$^{-1}$ at 157 nm and an oxygen content of 3 ppm.

\* \* \* \* \*